United States Patent
Ban et al.

(10) Patent No.: US 10,783,981 B1
(45) Date of Patent: Sep. 22, 2020

(54) SEMICONDUCTOR MEMORY CAPABLE OF REDUCING AN INITIAL TURN-ON VOLTAGE OF A MEMORY CELL USING A STRESS PULSE IN A TEST MODE, AND METHOD FOR DRIVING THE SAME

(71) Applicant: SK hynix Inc., Icheon (KR)

(72) Inventors: Sang-Hyun Ban, Icheon (KR);
Tae-Hoon Kim, Seongnam (KR);
Woo-Tae Lee, Seoul (KR); Hye-Jung Choi, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 15/945,620

(22) Filed: Apr. 4, 2018

Related U.S. Application Data

(60) Provisional application No. 62/483,218, filed on Apr. 7, 2017.

(51) Int. Cl.
| | |
|---|---|
| *G11C 29/50* | (2006.01) |
| *H01L 27/22* | (2006.01) |
| *G11C 11/16* | (2006.01) |
| *H01L 45/00* | (2006.01) |
| *H01L 43/08* | (2006.01) |
| *H01L 27/24* | (2006.01) |
| *G11C 13/00* | (2006.01) |

(Continued)

(52) U.S. Cl.
CPC .......... *G11C 29/50* (2013.01); *G06F 12/0802* (2013.01); *G11C 11/161* (2013.01); *G11C 11/1653* (2013.01); *G11C 11/1673* (2013.01); *G11C 13/004* (2013.01); *G11C 13/0004* (2013.01); *G11C 13/0007* (2013.01); *G11C 13/0023* (2013.01); *H01L 23/528* (2013.01); *H01L 27/222* (2013.01); *H01L 27/2463* (2013.01); *H01L 43/08* (2013.01); *H01L 45/06* (2013.01); *G11C 2029/0407* (2013.01); *G11C 2029/5004* (2013.01); *G11C 2213/31* (2013.01); *G11C 2213/32* (2013.01); *H01F 10/329* (2013.01); *H01F 10/3254* (2013.01); *H01L 43/10* (2013.01); *H01L 45/144* (2013.01); *H01L 45/146* (2013.01); *H01L 45/147* (2013.01)

(58) Field of Classification Search
None
See application file for complete search history.

(56) References Cited

U.S. PATENT DOCUMENTS

| | | | | |
|---|---|---|---|---|
| 2008/0106930 | A1* | 5/2008 | Kim | G11C 8/06 365/163 |
| 2012/0267596 | A1* | 10/2012 | Tseng | H01L 45/08 257/4 |

(Continued)

FOREIGN PATENT DOCUMENTS

KR  100825777 B1  4/2008

*Primary Examiner* — J. H. Hur

(57) ABSTRACT

An electronic device includes a semiconductor memory. The semiconductor memory includes a plurality of first lines; a plurality of second lines; a plurality of memory cells disposed in respective intersection regions between the first lines and the second lines and coupled between the first lines and the second lines, the plurality of memory cells having a first turn-on voltage; and a test circuit block suitable for applying a stress pulse having a voltage level equal to or higher than the first turn-on voltage to one or more first lines selected from the first lines in a test mode.

15 Claims, 8 Drawing Sheets

(51) Int. Cl.
*G06F 12/0802* (2016.01)
*H01L 23/528* (2006.01)
*G11C 29/04* (2006.01)
*H01L 43/10* (2006.01)
*H01F 10/32* (2006.01)

(56) References Cited

U.S. PATENT DOCUMENTS

| | | | |
|---|---|---|---|
| 2013/0170283 A1* | 7/2013 | Lan | G11C 13/0007 365/148 |
| 2015/0162529 A1* | 6/2015 | Lee | H01L 45/1253 711/118 |

* cited by examiner

SEMICONDUCTOR MEMORY CAPABLE OF REDUCING AN INITIAL TURN-ON VOLTAGE OF A MEMORY CELL USING A STRESS PULSE IN A TEST MODE, AND METHOD FOR DRIVING THE SAME

CROSS-REFERENCE TO RELATED APPLICATIONS

The present application claims priority to U.S. Provisional Patent Application No. 62/483,218, entitled "ELECTRONIC DEVICE AND METHOD FOR DRIVING THE SAME" and filed on Apr. 7, 2017, which is incorporated herein by reference in its entirety.

TECHNICAL FIELD

This patent document relates to memory circuits, memory devices, and their applications in electronic devices or systems.

BACKGROUND

Recently, as electronic appliances trend toward miniaturization, low power consumption, high performance, multi-functionality, and so on, semiconductor devices capable of storing information in various electronic appliances such as computers, portable communication devices, and so on, have been demanded. Such semiconductor devices include semiconductor devices that have a variable resistance characteristic, i.e., semiconductor devices that can store data by switching between different resistance states according to an applied voltage or current. Such semiconductor devices include, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits and memory devices, as well as their applications in electronic devices and systems. The disclosed technology also includes various implementations of an electronic device and a method of driving the same. The electronic device may include a semiconductor memory that can reduce an initial turn-on voltage of a memory cell.

In an implementation, there is provided an electronic device including a semiconductor memory. The semiconductor memory may include: a plurality of first lines; a plurality of second lines; a plurality of memory cells disposed in respective intersection regions between the first lines and the second lines and coupled between the first lines and the second lines, the plurality of memory cells having a first turn-on voltage; and a test circuit block suitable for applying a stress pulse having a voltage level equal to or higher than the first turn-on voltage to one or more first lines selected from the first lines in a test mode.

The plurality of memory cells may have a plurality of second turn-on voltages in an initial state, each of the second turn-on voltages being higher than the first turn-on voltage, the plurality of memory cells being initially turned on at the plurality of second turn-on voltages in the test mode. The stress pulse may have a voltage level that is lower than an expectation value of the plurality of second turn-on voltages. The test circuit block may apply a first maximum voltage to a selected first line when a selected memory cell coupled to the selected first line is initially turned on, the first maximum voltage having a voltage level that is equal to or higher than an expectation value of the second turn-on voltages. The test circuit block may apply a second maximum voltage to a selected first line when a selected memory cell coupled to the selected first line is initially turned on, the second maximum voltage having a voltage level that is higher than the voltage level of the stress pulse and lower than an expectation value of the second turn-on voltages. The semiconductor memory may further include: a sensing block configured to sense whether a selected memory cell among the memory cells is turned on or not, based on a cell current flowing through a selected second line among the second lines in the test mode, the selected second line being coupled to the selected memory cell; and a control block configured to control whether the stress pulse is additionally applied to the selected memory cell, based on a sensing result of the sensing block in the test mode. The test circuit block may substantially simultaneously or sequentially apply the stress pulse to the first lines. The stress pulse may pulse one or more times in a single stress period.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, there is provided a method for driving an electronic device including a semiconductor memory. The method may include: applying a first maximum voltage to a selected memory cell of a plurality of memory cells; determining whether the selected memory cell is turned on or not; and applying a stress pulse to the selected memory cell when the selected memory cell is determined to be in a turned-off state, the stress pulse having a lower voltage level than the first maximum voltage.

Each of the plurality of memory cells may have a first turn-on voltage in a normal state, and the plurality of memory cells have a plurality of second turn-on voltages, respectively, in an initial state, the plurality of second turn-on voltages having higher voltage levels than the first turn-on voltage. The first maximum voltage may have a voltage level that is equal to or higher than an expectation value of the second turn-on voltages of the memory cells, and the stress pulse may have a voltage level that is equal to or lower than the expectation value of the second turn-on voltages.

In an implementation, there is provided a method for driving an electronic device including a semiconductor memory. The method may include: applying a stress pulse simultaneously to a plurality of memory cells; determining whether the memory cells are turned on or not; and applying a second maximum voltage to a selected memory cell that is in a turned-off state among the plurality of memory cells.

The method may further include: deciding whether the selected memory cell is turned on or not after applying the second maximum voltage; and applying the stress pulse to the selected memory cell when the selected memory cell is decided to be in the turned-off state. Each of the plurality of memory cells may have a first turn-on voltage in a normal state, and the plurality of memory cells have a plurality of second turn-on voltages, respectively, in an initial state, the plurality of second turn-on voltages having higher voltage levels than the first turn-on voltage. The second maximum voltage may have a voltage level that is equal to or higher than a voltage level of the stress pulse and equal to or lower than an expectation value of the second turn-on voltages.

DETAILED DESCRIPTION

Figure 1:
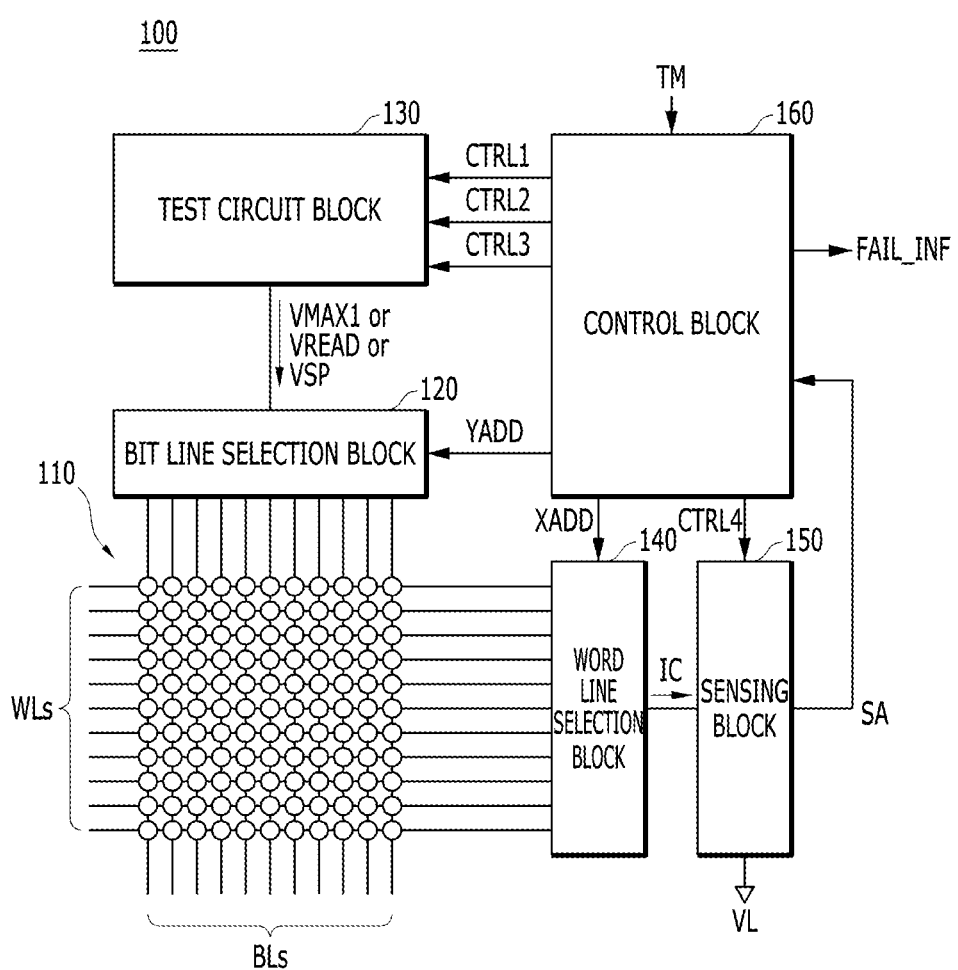
FIG. 1 is a block diagram illustrating a memory device in accordance with an implementation of the present disclosure.

Various examples and implementations of the disclosed technology are described below, in detail, with reference to the accompanying drawings.

The present disclosure may, however, be embodied in different forms and should not be construed as limited to the implementations set forth herein. Rather, these implementations are provided so that this disclosure will be thorough and complete, and will fully convey the scope of the present disclosure to those skilled in the art. Throughout the disclosure, like reference numerals refer to like parts throughout the various figures and implementations of the present disclosure.

A semiconductor memory device in accordance with implementations of the disclosed technology may include a variable resistance element that exhibits a variable resistance characteristic, i.e., a variable resistance element that represents different digital bits or states by exhibiting different resistance values. In implementations, such a variable resistance element may include a single-layer or a multi-layer structure exhibiting the variable resistance characteristic, and may include any of a material used in a RRAM, PRAM, STTRAM, MRAM or FRAM (e.g., a ferromagnetic material); a ferroelectric material; a phase change material, such as a chalcogenide material; a metal oxide, such as a perovskite material; and a transition metal oxide.

The variable resistance element may include a metal oxide, a perovskite material, or both. The metal oxide may include a transition metal oxide such as a nickel (Ni) oxide, a titanium oxide (TiO), a hafnium oxide (HfO), a zirconium oxide (ZrO), a tungsten oxide (WO), or a cobalt oxide (CoO). The perovskite material may include a material such as a strontium titanium oxide (STO: SrTiO) or a praseodymium calcium manganese oxide (PCMO: PrCaMnO).

Moreover, the variable resistance element may include a phase change material. The phase change material may include a chalcogenide material, such as germanium-antimony-tellurium (GST: GeSbTe). The variable resistance element switches between different resistance states by changing its structure into a crystalline state or an amorphous state according to heat applied to the phase change material.

The variable resistance element may include two magnetic layers and a tunnel barrier layer interposed between the two magnetic layers. The magnetic layer may include any of nickel-iron-cobalt (NiFeCo), Cobalt-iron (CoFe), etc. The tunnel barrier layer may include aluminum oxide ($Al_2O_3$). The variable resistance element may switch between two different resistance states according to magnetization directions of the two magnetic layers. For example, the variable resistance element may be in a low resistance state when the magnetization directions of the two magnetic layers are parallel, and be in a high resistance state when the magnetization directions of the two magnetic layers are anti-parallel.

FIG. 1 is a block diagram illustrating a memory device 100 in accordance with an implementation of the present disclosure.

Referring to FIG. 1, the memory device 100 may include a memory cell array 110, a bit line selection block 120, a test circuit block 130, a word line selection block 140, a sensing block 150, and a control block 160.

The memory cell array 110 may include a plurality of memory cells. For example, the memory cell array 110 may have a cross-point array structure in which the memory cells are disposed in respective intersection regions between a plurality of bit lines BLs and a plurality of word lines WLs, and may be coupled between the plurality of bit lines BLs and the plurality of word lines WLs.

Each of the memory cells may include a variable resistance element and a selection element. The variable resistance element may be in a high resistance state (e.g., a 'reset' state) or a low resistance state (e.g., a 'set' state) according to a logic value of write data stored in the memory cell. For example, the variable resistance element may include a phase-change material. The selection element may be turned on due to a voltage difference between both ends of the memory cell. For example, the selection element may include an ovonic threshold switch (OTS).

Each of the memory cells having the above structure may be turned on due to a voltage difference between both ends of the memory cell. For example, each of the memory cells may be designed to have a normal turn-on voltage (hereinafter, referred to as a "turn-on voltage"), and thus may be turned on when the voltage difference between both ends thereof exceeds the turn-on voltage in a normal state or normal mode. However, when each of the memory cells is initially turned on in a test mode before performing the normal mode, each of the memory cells may have an initial turn-on voltage (hereinafter, referred to as a "firing voltage") that is higher than the turn-on voltage. Consequently, in a test operation, an operation for initially turning on the memory cells after the memory device 100 has been manufactured, i.e., a firing operation, may be performed on the memory cells.

Since a memory cell in a fresh state, i.e., in an initial state before performing the firing operation, has a high resistance state, the firing voltage of the memory cell may have a substantially high level. Typically, the firing voltage may have a higher voltage level than a threshold voltage of the memory cell. The firing voltage may be affected by a processing environment, damage occurring during processing, an interface state between an electrode and a variable resistance element, a degree of material oxidation of a selection element, etc. The firing operation may convert a material structure of the selection element in the memory cell, which is in the fresh state, from an unstable state into a relatively stable state. The firing operation may form a filament in the selection element. When the firing operation is successfully performed, the memory cell in the fresh state may be converted into a memory cell that is converted between resistance states based on the threshold voltage, instead of the firing voltage, in a normal state. Each of the memory cells may have a unique firing voltage. In other words, the memory cells in the memory cell array 110 may have a plurality of firing voltages having different voltage levels. Accordingly, when the firing operation is performed on the memory cells in the same condition, the firing operation may not be successfully performed on at least one memory cell among the memory cells.

The bit line selection block 120 may couple one of the bit lines BLs (hereinafter, referred to as a "selected bit line") to the test circuit block 130 based on a bit line selection signal YADD.

The test circuit block 130 may apply a first maximum voltage VMAX1 to the selected bit line in response to a first test control signal CTRL1 during a firing period. The first maximum voltage VMAX1 may be substantially the same as or higher than an expectation value of the firing voltages for the memory cells. The expectation value of the firing voltages represents a firing voltage level that the memory cells are expected to have in the initial state.

The test circuit block 130 may apply a read voltage VREAD to the selected bit line in response to a second test control signal CTRL2 during a sensing period. When a memory cell written in a low resistance state is sensed, the read voltage VREAD may be higher than a turn-on voltage of a memory cell in a low resistance state, and may be lower than a turn-on voltage of a memory cell in a high resistance state. When a memory cell written in a high resistance state or a memory cell having an undefined resistance state is sensed, the read voltage VREAD may be higher than the turn-on voltage of the memory cell in the high resistance state, and may be substantially the same as or lower than the first maximum voltage VMAX1.

The test circuit block 130 may apply a stress pulse VSP to the selected bit line in response to a third test control signal CTRL3 during a stress period. The stress pulse VSP may provide a pulse at least one time during the stress period. For example, the stress pulse VSP may include a single-pulse signal, which pulses one time during the stress period and has a relatively long pulse width, or a multi-pulse signal, which periodically pulses more than two times during the stress period and has a relatively short pulse width. A voltage level of the stress pulse VSP may be substantially the same as or lower than the first maximum voltage VMAX1. As the voltage level of the stress pulse VSP gets closer to the first maximum voltage VMAX1, the stress period may be shorter. In an implementation, the voltage level of the stress pulse VSP may be equal to or higher than the turn-on voltage of the memory cells, and may be equal to or lower than the expectation value of the firing voltages for the memory cells. The test circuit block 130 may include a read circuit that is enabled in a normal read mode.

The word line selection block 140 may couple one of the word lines WLs (hereinafter, referred to as a "selected word line") to the sensing block 160 based on a word line selection signal XADD.

The sensing block 150 may sense a cell current IC transmitted through the selected word line in response to a fourth test control signal CTRL4 during the sensing period. For example, the sensing block 150 may sense whether one of the memory cells (hereinafter, referred to as a "selected memory cell") is turned on or not based on the cell current IC and generate a sensing signal SA corresponding to the sensed result. When it is sensed that the selected memory cell is turned on, the sensing signal SA may be generated to include information corresponding to the turned-on memory cell. On the other hand, when it is sensed that the selected memory cell is not turned on, i.e., remains turned off, the sensing signal SA may be generated to include information corresponding to the turned-off memory cell. The sensing block 150 may apply a low voltage VL to the selected word line in response to the fourth test control signal CTRL4 during the firing period, the stress period, and the sensing period. For example, the low voltage VL may include a ground voltage or a negative voltage.

The control block 160 may generate the first to fourth test control signals CTRL1, CTRL2, CTRL3, and CTRL4, the bit line selection signal YADD, and the word line selection signal XADD in response to a test mode signal TM. For example, the control block 160 may enable the first test control signal CTRL1 and generate the bit line selection signal YADD and the word line selection signal XADD, which correspond to the selected memory cell, during the firing period of a test operation in the test mode. Moreover, the control block 160 may enable the second and fourth test control signals CTRL2 and CTRL4 and generate the bit line selection signal YADD and the word line selection signal XADD, which correspond to the turned-off memory cell, during the sensing period of the test operation. The control block 160 may enable the third test control signal CTRL3 and generate the bit line selection signal YADD and the word line selection signal XADD, which correspond to the turned-off memory cell, during the stress period of the test operation.

The control block 160 may control whether the stress pulse VSP is additionally applied or not based on the sensing signal SA obtained after the firing period. For example, the control block 160 may enable the second test control signal CTRL2 during an additional stress period of the test operation when the selected memory cell is determined to be in a turned-off state. When it is finally determined that the selected memory cell still remains in the turned-off state after the additional stress period, the selected memory cell is determined as a failure memory cell based on the sensing signal SA obtained after the additional stress period, and thus the control block 160 may supply a failure information signal FAIL_INF corresponding to the failure memory cell to a test device (not illustrated). The failure information signal FAIL_INF may include address information of the failure memory cell.

Hereinafter, an operation of the memory device 100 having the afore-mentioned structure will be described.

When the memory device 100 is fabricated, the memory device 100 may perform the firing operation for initially turning on the memory cells included in the memory device 100. The firing operation may be performed under the control of the test device during a probe test. The firing operation in accordance with an implementation of the present disclosure may include applying the first maximum voltage VMAX1 to the selected memory cell during the firing period, determining whether the selected memory cell is turned on or not during the sensing period, and applying, during the stress period, the stress pulse VSP to the selected memory cell when the selected memory cell is determined to be in a turned-off state based on the sensing result. The firing operation will be described in detail with reference to FIG. 2.

Figure 2:
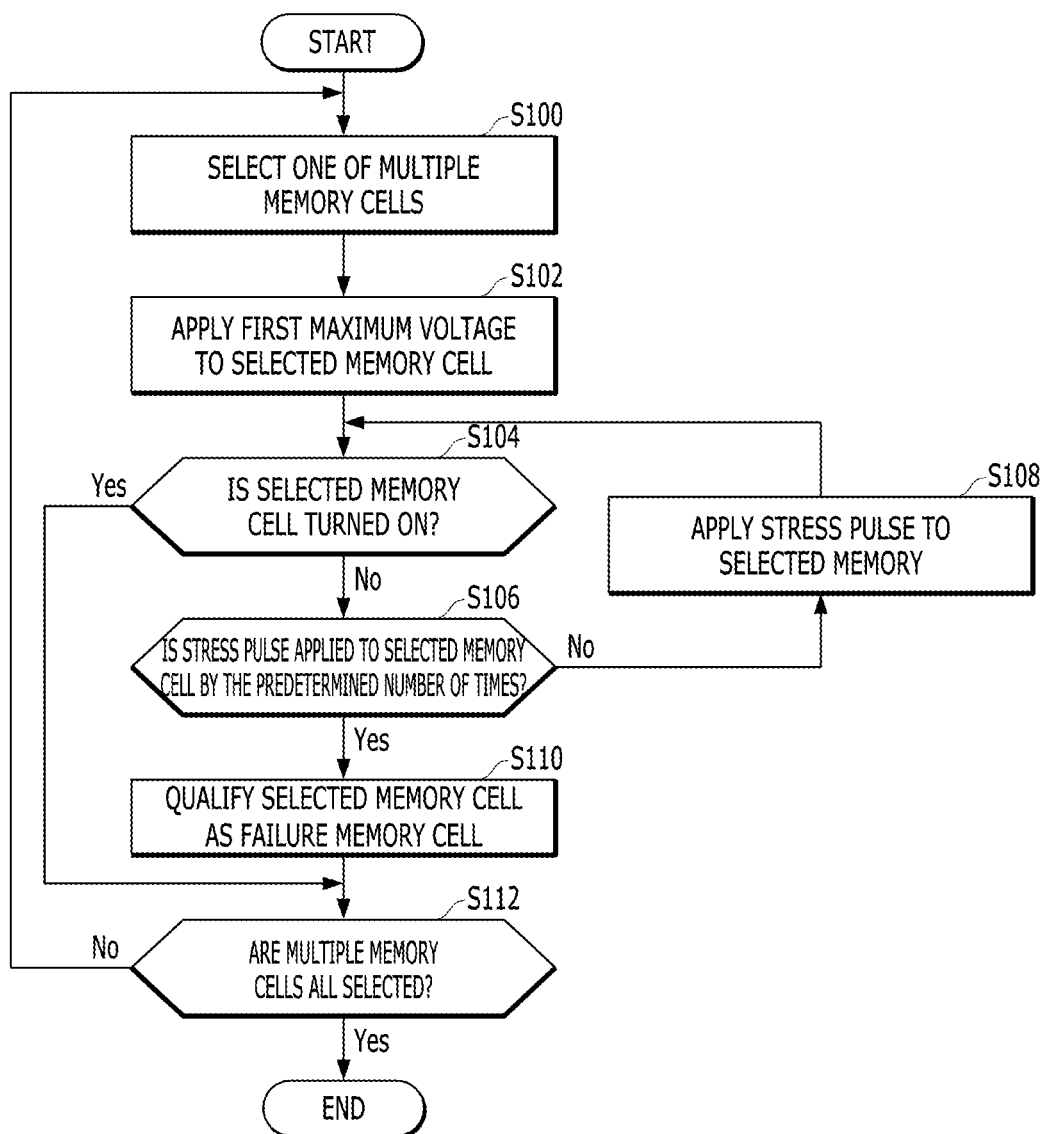
FIG. 2 is a flowchart for describing an operation of the memory device shown in FIG. 1.

FIG. 2 is a flowchart for describing the firing operation of the memory device 100 shown in FIG. 1.

Referring to FIGS. 1 and 2, when the test mode signal TM is enabled, the control block 160 may enable the first and fourth test control signals CTRL1 and CTRL4 and generate the bit line selection signal YADD and the word line selection signal XADD, which correspond to the selected memory cell, during a firing period of a test operation, which is activated in response to the test mode signal TM.

During the firing period, in step S100, one of multiple memory cells in the memory cell array 100 is selected. That is, the bit line selection block 120 may couple a selected bit line coupled to the selected memory cell to the test circuit block 130 based on the bit line selection signal YADD, and the word line selection block 140 may couple a selected word line coupled to the selected memory cell to the sensing block 150 based on the word line selection signal XADD.

In step S102, the test circuit bock 130 may apply the first maximum voltage VMAX1 to the selected memory cell through the selected bit line in response to the first test control signal CTRL1, and the sensing block 150 may apply the low voltage VL to the selected memory cell through the selected word line.

Since the first maximum voltage VMAX1 is applied to one end of the selected memory cell through the selected bit line and the low voltage VL is applied to the other end of the selected memory cell through the selected word line, a voltage difference between both ends of the selected memory cell may correspond to a voltage VMAX1-VL obtained by deducting the low voltage VL from the first maximum voltage VMAX1. When a firing voltage of the selected memory cell is lower than the voltage VMAX1-VL, the selected memory cell may be turned on. On the contrary, when the firing voltage of the selected memory cell is higher than the voltage VMAX1-VL, the selected memory cell may not be turned on. As described above, the multiple memory cells in the memory cell array 100 may have firing voltages having different voltage levels. Therefore, even though the voltage VMAX1-VL is properly set, a firing voltage of at least one of the multiple memory cells may have a higher voltage level than the voltage VMAX1-VL, and thus at least one memory cell may not be turned on by the voltage VMAX1-VL.

The control block 160 may enable the second and fourth test control signals CTRL2 and CTRL4 and generate the bit line selection signal YADD and the word line selection signal XADD, which correspond to the selected memory cell, during a sensing period of the test operation.

During the sensing period, the test circuit block 130 may apply the read voltage VREAD to the selected bit line in response to the second test control signal CTRL2, and the sensing block 150 may sense whether the selected memory cell is turned on or not based on a cell current IC transmitted through the selected word line after applying the low voltage VL to the selected word line, in step S104. For example, the sensing block 150 may compare the cell current IC with a reference current (not illustrated) and generate a sensing signal SA corresponding to the comparison result. In other words, the sensing signal SA may include information indicating whether the selected memory cell is turned on or not.

During the sensing period, a write operation may be performed before the test circuit block 130 and the sensing block 150 operate. The write operation may include a series of processes of storing write data corresponding to a low resistance state in the selected memory cell. Since it is possible to accurately predict the cell current IC according to whether the selected memory cell is turned on or not when the write operation is performed, the sensing block 150 may accurately perform a sensing operation. In this case, although not illustrated in FIG. 1, a write circuit for performing the write operation may be included in the memory device 100.

When the selected memory cell is determined to be in a turned-off state as a sensing result of the sensing block 150, the control block 160 may enable the third test control signal CTRL3 and generate the bit line selection signal YADD and the word line selection signal XADD, which correspond to the selected memory cell, during a stress period, based on the sensing signal SA. The control block 160 may check how many times the stress period has been repeatedly applied to the selected memory cell in step S106. In other words, the control block 160 may check whether the stress period for turning on the selected memory cell has been repeated a predetermined number of times.

If the stress period has not been repeated the predetermined number times, the test circuit block 130 may apply the stress pulse VSP to the selected memory cell through the selected bit line in response to the third test control signal CTRL3, and the sensing block 150 may apply the low voltage VL to the selected memory cell through the selected word line, in step S108. A voltage level of the stress pulse VSP may be substantially the same as or lower than the first maximum voltage VMAX1. As the voltage level of the stress pulse VSP gets closer to the first maximum voltage VMAX1, the stress period may become shorter. When the stress pulse VSP is applied to the selected memory cell, the firing voltage of the selected memory cell may be reduced. This may be because continuous exertion of electrical stress on a selection element included in the selected memory cell helps a material structure of the selection element to become stable, helps a filament to be formed in the selection element, or both. That is, the stabilized material structure of the selection element and/or the filament formed in the selection element may reduce the firing voltage of the selection memory cell.

The control block 160 may control the test circuit block 130 and the sensing block 150 so that the sensing period and the stress period are repeated the predetermined number of times.

When it is determined that the selection memory cell still remains in the turned-off state in step S104 and that the sensing period and the stress period have been repeated the predetermined number of times in step S106, the control block 160 may stop the stress pulse VSP from being applied to the selected memory cell anymore, and qualify the selected memory cell as a failure memory cell, in step S110. For example, the control block 160 may send the failure information signal FAIL_INF corresponding to the failure memory cell to the test device.

When the selected memory cell is turned on or is qualified as the failure memory cell, the control block 160 may control the bit line selection block 120, the test circuit block 130, the word line selection block 140, and the sensing block 150 so that the afore-mentioned steps S100 to S110 are repeatedly carried out on the remaining memory cells among the memory cells in the memory cell array 110.

In step S112, if it is determined that all the memory cells in the memory cell array 110 are selected to perform the afore-mentioned steps S102 to S110, the firing operation of the memory device 100 is terminated. If otherwise, the operation returns to step S100 to select another memory cell, and the afore-mentioned steps S102 to S110 are performed on the other selected memory cell.

Figure 3:
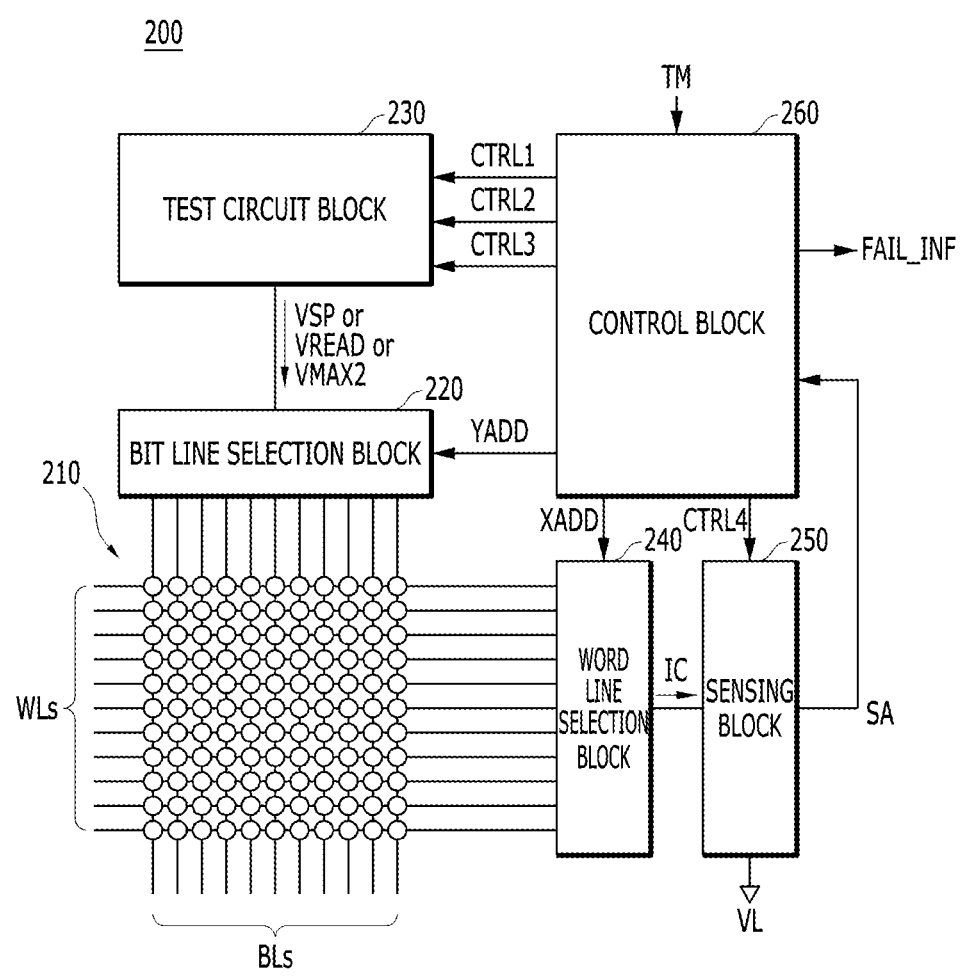
FIG. 3 is a block diagram illustrating a memory device in accordance with another implementation of the present disclosure.

FIG. 3 is a block diagram illustrating a memory device 200 in accordance with another implementation of the present disclosure.

For the sake of convenience in description, the memory device 200 uses the same names for components and configurations that are the same as or similar to those appearing in FIG. 1.

Referring to FIG. 3, the memory device 200 may include a memory cell array 210, a bit line selection block 220, a test circuit block 230, a word line selection block 240, a sensing block 250, and a control block 260.

Since the memory cell array 210, the bit line selection block 220, the test circuit block 230, the word line selection block 240, the sensing block 250, and the control block 260 are the same or similar to the memory cell array 110, the bit line selection block 120, the test circuit block 130, the word line selection block 140, the sensing block 150, and the control block 160, respectively, illustrated in FIG. 1, detailed descriptions thereon are omitted.

However, the control block 260 may control an order of a stress period, a sensing period, and a firing period differently from the test operation of the control block 160. Moreover, during the firing period, a second maximum voltage VMAX2 may be applied from the test circuit block 230 to the bit line selection block 220, and the second maximum voltage VMAX2 may have a lower voltage level than the first maximum voltage VMAX1 described above with reference to FIG. 1. Detailed descriptions thereon will be provided below.

Hereinafter, an operation of the memory device 200 will be described.

When the memory device 200 is fabricated, the memory device 200 may perform a firing operation for initially turning on a plurality of memory cells included in the memory cell array 210. The firing operation may be performed under the control of a test device (not shown) during a probe test. The firing operation in accordance with an implementation of the present disclosure may include applying a stress pulse VSP simultaneously to the plurality of memory cells during a stress period, determining whether the memory cells are turned on or not during a sensing period, and applying the second maximum voltage VMAX2 to a turned-off memory cell among the plurality of memory cells during a firing period. The firing operation will be described in detail with reference to FIG. 4.

Figure 4:
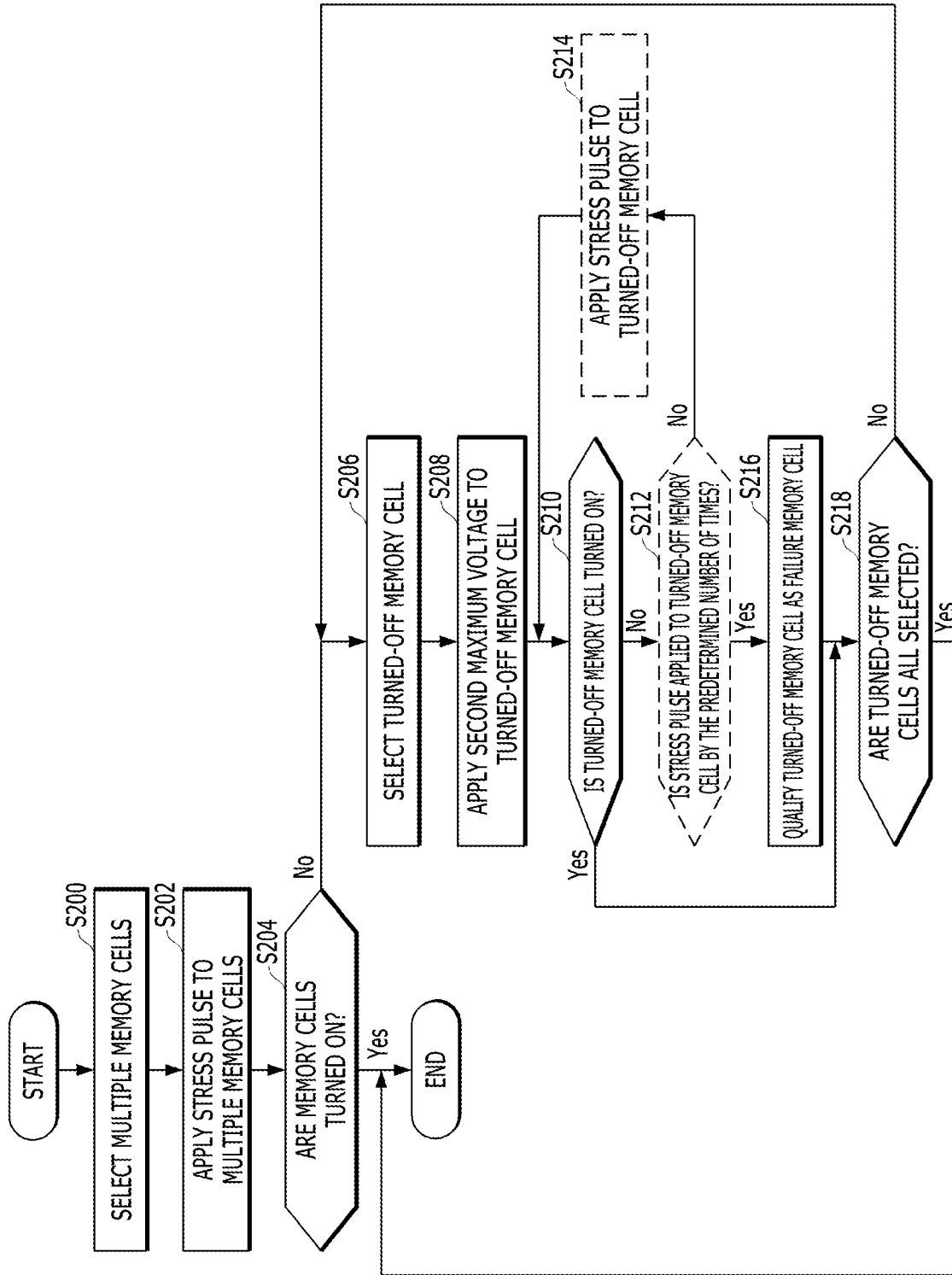
FIG. 4 is a flowchart for describing an operation of the memory device shown in FIG. 3.

FIG. 4 is a flowchart for describing the firing operation of the memory device 200 shown in FIG. 3.

Referring to FIGS. 3 and 4, the control block 260 may enable a first test control signal CTRL1 and generate a bit line selection signal YADD and a word line selection signal XADD during the stress period in response to a test mode signal TM.

During the stress period, the bit line selection block 220 may couple a plurality of bit lines BLs to the test circuit block 230 based on the bit line selection signal YADD, and the word line selection block 240 may couple a plurality of word lines WLs to the sensing block 250 based on the word line selection signal XADD. Therefore, multiple memory cells, i.e., all of the memory cells in the memory cell array 210, may be sequentially selected based on the bit line selection signal YADD and the word line selection signal XADD, in step S200.

During the stress period, the test circuit block 230 may apply the stress pulse VSP to the bit lines BLs in response to the first test control signal CTRL1, in step S202. The stress pulse VSP may provide a pulse at least one time during the stress period, and a voltage level of the stress pulse VSP may be the same as or lower than the second maximum voltage VMAX2. Therefore, since electrical stress due to the stress pulse VSP is exerted on the memory cells during the stress period, the firing voltage of each of the memory cells may be reduced. This may be because continuous exertion of electrical stress on a selection element included in a memory cell helps a material structure of the selection element to become stable, helps a filament to be formed in the selection element, or both. As the firing voltage is reduced due to the stabilized material structure of the selection element, the filament of the selection element, or both, the second maximum voltage VMAX2 used during the firing period may be designed to be equal to or lower than the first maximum voltage VMAX1. In an implementation, the voltage level of the second maximum voltage VMAX2 may be equal to or lower than an expectation value of the firing voltages of the memory cells.

After the stress period, the control block 260 may enable second and fourth test control signals CTRL2 and CTRL4 and generate the bit line selection signal YADD and the word line selection signal XADD during the sensing period in response to the test mode signal TM.

During the sensing period, the bit line selection block 220 may sequentially couple the bit lines BLs to the test circuit block 230 in a predetermined order based on the bit line selection signal YADD, and sequentially couple the word lines WLs to the sensing block 250 in a predetermined order based on the word line selection signal XADD. As a result, one of the bit lines BLs (hereinafter, referred to as a "selected bit line") is coupled to the test circuit block 230 based on the bit line selection signal YADD, and one of the word lines WLs (hereinafter, referred to as a "selected word line") is coupled to the sensing block 250 based on the word line selection signal XADD. In this case, a memory cell among the memory cells, which is coupled to the selected bit line and the selected word line, may be a "selected memory cell."

During the sensing period, the test circuit block 230 may apply a read voltage VREAD to the selected bit line in response to the second test control signal CTRL2, and the sensing block 250 may apply a low voltage VL to the selected word line in response to the fourth test control signal CTRL4. Subsequently, the sensing block 250 may sequentially sense whether the memory cells are turned on or not based on cell currents ICs that are sequentially received through the selected word line, in step S204. For example, the sensing block 250 may compare each of the cell currents ICs with a reference current (not illustrated), and sequentially generate a sensing signal SA corresponding to each of the comparison results. The sensing signal SA may include information indicating whether the selected memory cell is turned on or not.

During the sensing period, a write operation may be performed on the memory cells before the test circuit block 230 and the sensing block 250 operate. The write operation may include a series of processes of storing write data corresponding to a low resistance state in the selected memory cell. Since it is possible to accurately predict the cell current IC according to whether the selected memory cell is turned on or not when the write operation is performed, the sensing block 250 may accurately perform a sensing operation. In this case, although not illustrated in FIG. 3, a write circuit for performing the write operation may be included in the memory device 200.

After the sensing period, the control block 260 may enable a third test control signal CTRL3 and generate a bit line selection signal YADD and a word line selection signal XADD, which are coupled to a turned-off memory cell, during the firing period based on the test mode signal TM and the sensing signal SA. The turned-off memory cell is a memory cell that still remains in a turned-off state after the stress voltage VSP has been applied thereto.

During the firing period, the bit line selection block 220 may couple a bit line coupled to the turned-off memory cell, among the bit lines BLs, to the test circuit block 230 based on the bit line selection signal YADD, and the word line selection block 240 may couple a word line coupled to the turned-off memory cell, among the word lines WLs, to the sensing block 250 based on the word line selection signal XADD.

During the firing period, the test circuit block 230 may apply the second maximum voltage VMAX2 to the bit line coupled to the turned-off memory cell in response to the third test control signal CTRL3, and the sensing block 250 may apply the low voltage VL to the word line coupled to the turned-off memory cell in response to the fourth test control signal CTRL4.

During the firing period, since the second maximum voltage VMAX2 is applied to one end of the turned-off memory cell through the bit line, and the low voltage VL is applied to the other end of the turned-off memory cell through the word line, a voltage difference between the both ends of the turned-off memory cell may correspond to a voltage VMAX2-VL obtained by deducting the low voltage VL from the second maximum voltage VMAX2. In this case, when a firing voltage of the turned-off memory cell is lower than the voltage VMAX2-VL, the turned-off memory cell may be turned on. On the contrary, when the firing voltage of the turned-off memory cell is higher than the voltage VMAX2-VL, the turned-off memory cell may remain in a turned-off state. Since a plurality of memory cells may have filing voltages having different voltage levels, the firing voltage of the turned-off memory cell may be lower or higher than the voltage VMAX2-VL.

The control block 260 may enable the second test control signal CTRL2 during an additional sensing period after the firing period, in response to the test mode signal TM.

During the additional sensing period, the test circuit block 230 may apply the read voltage VREAD to the bit line coupled to the turned-off memory cell in response to the second test control signal CTRL2, and the sensing block 250 may sense whether the turned-off memory cell is turned on or not based on a cell current IC received through the word line coupled to the turned-off memory cell after applying the low voltage VL to the word line, in step S210. For example, the sensing block 250 may compare the cell current IC with the reference current (not illustrated) and generate a sensing signal SA corresponding to the comparison result.

When the turned-off memory cell remains in the turned-off state even after the additional sensing period, the control block 260 may check how many times the stress period has been repeated for the turned-off memory cell, in step S212. In other words, the control block 260 may check whether the stress period for turning on the turned-off memory cell has been repeated a predetermined number of times.

If it is determined, in step S212, that the stress period for turning on the turned-off memory cell has not been repeated by the predetermined number of times, the control block 260 may control the stress pulse VSP to be additionally applied to the turned-off memory cell during an additional stress period.

During the additional stress period, the test circuit block 230 may apply the stress pulse VSP to the bit line that is coupled to the turned-off memory cell in response to the first test control signal CTRL1, and the sensing block 250 may apply the low voltage VL to the word line coupled to the turned-off memory cell, in step S214.

The control block 260 may control the test circuit block 230 and the sensing block 250 so that the additional sensing period and the additional stress period are repeated the predetermined number of times.

When it is determined that the turned-off memory cell still remains in the turned-off state in step S210 and that the additional sensing period and the additional stress period has been repeated by the predetermined number of times in step S212, the control block 260 may control the stress pulse VSP not to be applied to the turned-off memory cell anymore and qualify the turned-off memory cell as a failure memory cell, in step S216. For example, the control block 260 may send a failure information signal FAIL_INF corresponding to the failure memory cell to the test device.

Meanwhile, in another implementation, the steps S212 and S214 corresponding to the additional stress period may be omitted. In this implementation, the stress period is not repeated.

When the turned-off memory cell is turned on or is qualified as the failure memory cell, the control block 260 may control the bit line selection block 220, the test circuit block 230, the word line selection block 240, and the sensing block 250 so that the afore-mentioned steps S206 to S216 are repeatedly carried out on the remaining turned-off memory cells among the memory cells in the memory cell array 210. When it is determined in step S218 that all turned-off memory cells are selected and steps S208 to S216 are selectively performed on all of the turned-off memory cells, the firing operation of the memory device 200 is terminated.

According to the implementations of the present disclosure, it is possible to minimize the number of failure memory cells during a firing operation by reducing a firing voltage using electrical stress, and to reduce a voltage level of a maximum voltage used for the firing operation through processes of applying the electrical stress on memory cells in advance. Consequently, operational characteristics of a semiconductor memory may be improved.

The above and other memory circuits or semiconductor devices based on the disclosed technology may be used in a range of devices or systems. FIGS. 5-9 provide some examples of devices or systems that may implement the memory circuits disclosed herein.

Figure 5:
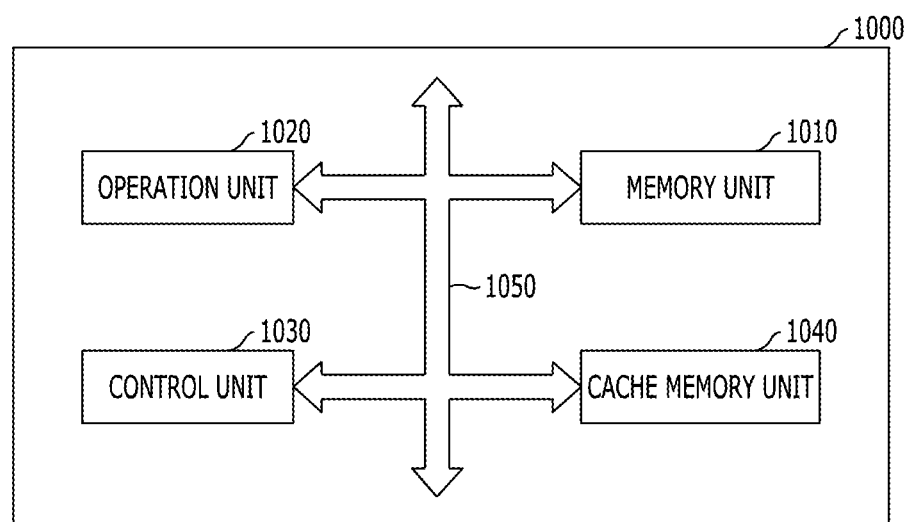
FIG. 5 is an example of a configuration diagram of a microprocessor implementing memory circuitry based on an implementation of the disclosed technology.

FIG. 5 is an example of a configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of first lines; a plurality of second lines; a plurality of memory cells disposed in respective intersection regions between the first lines and the second lines and coupled between the first lines and the second lines, the plurality of memory cells having a first turn-on voltage; and a test circuit block suitable for applying a stress pulse having a voltage level equal to or higher than the first turn-on voltage to one or more first lines selected from the first lines in a test mode. Through this, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
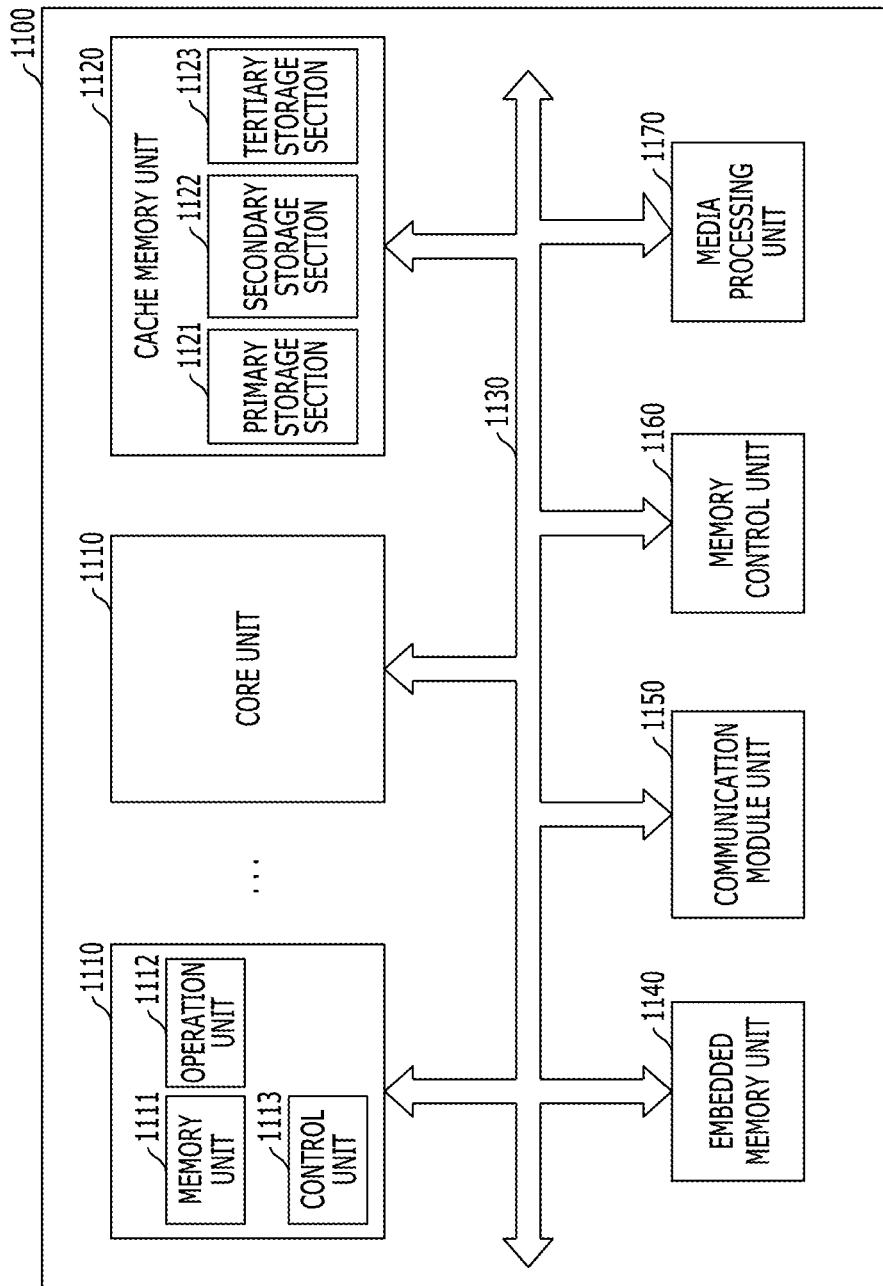
FIG. 6 is an example of a configuration diagram of a processor implementing memory circuitry based on an implementation of the disclosed technology.

FIG. 6 is an example of a configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of first lines; a plurality of second lines; a plurality of memory cells disposed in respective intersection regions between the first lines and the second lines and coupled between the first lines and the second lines, the plurality of memory cells having a first turn-on voltage; and a test circuit block suitable for applying a stress pulse having a voltage level equal to or higher than the first turn-on voltage to one or more first lines selected from the first lines in a test mode. Through this, characteristics of the cache memory unit 1120 may be improved. As a consequence, performance characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
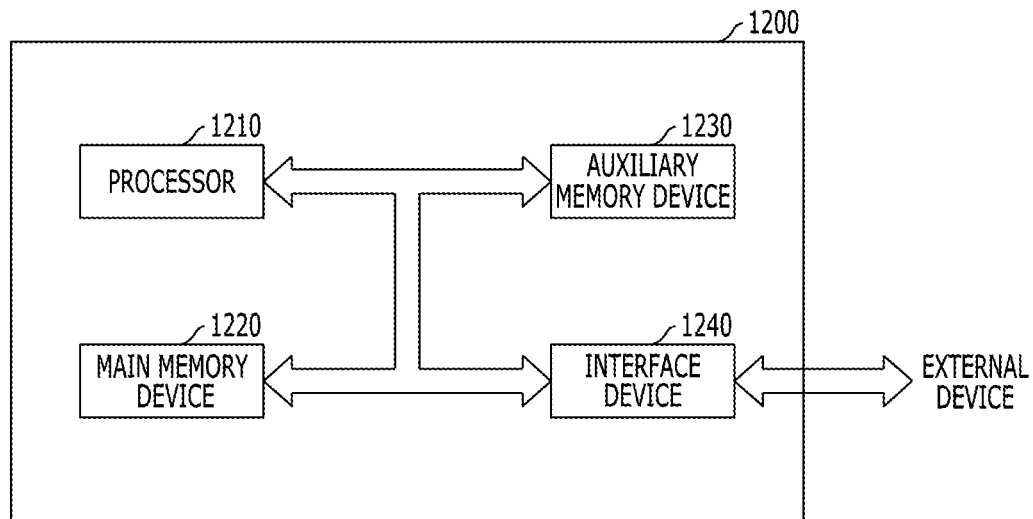
FIG. 7 is an example of a configuration diagram of a system implementing memory circuitry based on an implementation of the disclosed technology.

FIG. 7 is an example of a configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of first lines; a plurality of second lines; a plurality of memory cells disposed in respective intersection regions between the first lines and the second lines and coupled between the first lines and the second lines, the plurality of memory cells having a first turn-on voltage; and a test circuit block suitable for applying a stress pulse having a voltage level equal to or higher than the first turn-on voltage to one or more first lines selected from the first lines in a test mode. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of first lines; a plurality of second lines; a plurality of memory cells disposed in respective intersection regions between the first lines and the second lines and coupled between the first lines and the second lines, the plurality of memory cells having a first turn-on voltage; and a test circuit block suitable for applying a stress pulse having a voltage level equal to or higher than the first turn-on voltage to one or more first lines selected from the first lines in a test mode. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
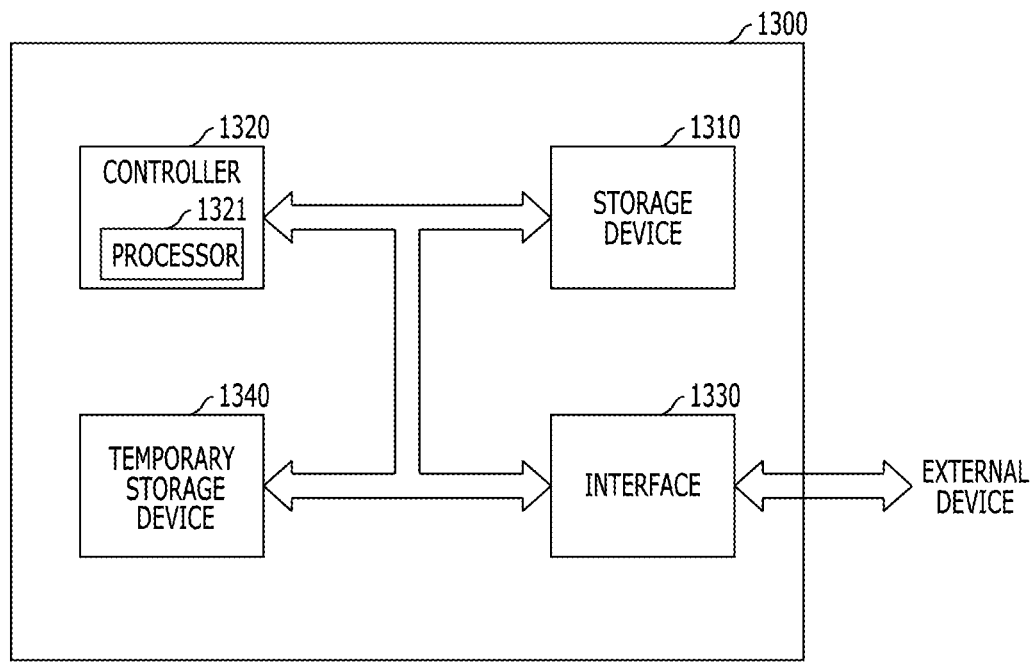
FIG. 8 is an example of a configuration diagram of a data storage system implementing memory circuitry based on an implementation of the disclosed technology.

FIG. 8 is an example of a configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above-mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a plurality of first lines; a plurality of second lines; a plurality of memory cells disposed in respective intersection regions between the first lines and the second lines and coupled between the first lines and the second lines, the plurality of memory cells having a first turn-on voltage; and a test circuit block suitable for applying a stress pulse having a voltage level equal to or higher than the first turn-on voltage to one or more first lines selected from the first lines in a test mode. Through this, characteristics of the temporary storage device 1340 may be improved. As a consequence, performance characteristics of the system 1300 may be improved.

Figure 9:
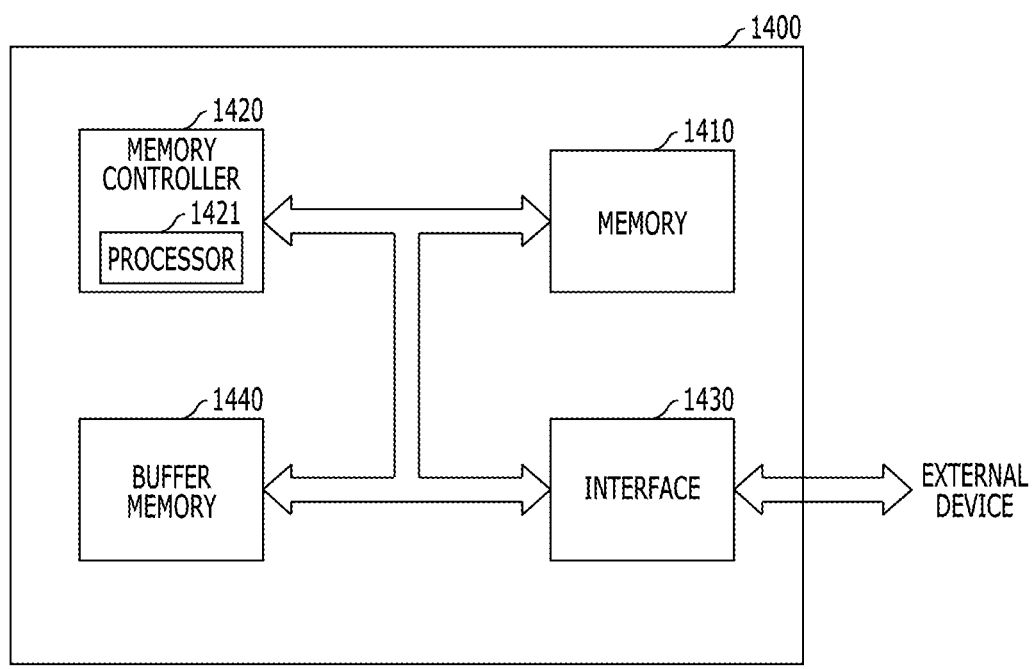
FIG. 9 is an example of a configuration diagram of a memory system implementing memory circuitry based on an implementation of the disclosed technology.

FIG. 9 is an example of a configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of first lines; a plurality of second lines; a plurality of memory cells disposed in respective intersection regions between the first lines and the second lines and coupled between the first lines and the second lines, the plurality of memory cells having a first turn-on voltage; and a test circuit block suitable for applying a stress pulse having a voltage level equal to or higher than the first turn-on voltage to one or more first lines selected from the first lines in a test mode. Through this, characteristics of the memory 1410 may be improved. As a consequence, performance characteristics of the memory system 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of first lines; a plurality of second lines; a plurality of memory cells disposed in respective intersection regions between the first lines and the second lines and coupled between the first lines and the second lines, the plurality of memory cells having a first turn-on voltage; and a test circuit block suitable for applying a stress pulse having a voltage level equal to or higher than the first turn-on voltage to one or more first lines selected from the first lines in a test mode. Through this, characteristics of the buffer memory 1440 may be improved. As a consequence, performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, initializing a resistance variable element is easy, and it is possible to secure reliable characteristics of the resistance variable element.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated in this patent document.

What is claimed is:

1. An electronic device including a semiconductor memory, wherein the semiconductor memory includes:
   a plurality of first lines;
   a plurality of second lines;
   a plurality of memory cells disposed in respective intersection regions between the first lines and the second lines and coupled between the first lines and the second lines, the plurality of memory cells having a first turn-on voltage in a normal state; and
   a test circuit block suitable for applying a stress pulse having a voltage level equal to or higher than the first turn-on voltage to a selected first line of the first lines, only when a selected memory cell of the plurality of memory cells is in a turned-off state, in a test mode, the selected memory cell being coupled to the selected first line,
   wherein the plurality of memory cells respectively have a plurality of second turn-on voltages in an initial state, each of the second turn-on voltages being higher than the first turn-on voltage, the plurality of memory cells being initially turned on at the plurality of second turn-on voltages in the test mode.

2. The electronic device according to claim 1, wherein the voltage level of the stress pulse is lower than an expectation value of the plurality of second turn-on voltages, the expectation value representing a voltage level that the second turn-on voltages are expected to have in the initial state, the expectation value being a single value.

3. The electronic device according to claim 2, wherein the test circuit block applies a first maximum voltage to the selected first line when the selected memory cell is initially turned on, the first maximum voltage having a voltage level that is equal to or higher than the expectation value of the second turn-on voltages.

4. The electronic device according to claim 1, wherein the test circuit block applies a second maximum voltage to a selected first line when a selected memory cell coupled to the selected first line is initially turned on, the second maximum voltage having a voltage level that is higher than the voltage level of the stress pulse and lower than an expectation value of the second turn-on voltages.

5. The electronic device according to claim 1, wherein the semiconductor memory further includes:
a sensing block configured to sense whether the selected memory cell is turned on or not, based on a cell current flowing through a selected second line among the second lines in the test mode, the selected second line being coupled to the selected memory cell; and
a control block configured to control whether the stress pulse is additionally applied to the selected memory cell, based on a sensing result of the sensing block in the test mode.

6. The electronic device according to claim 1, wherein the test circuit block substantially simultaneously or sequentially applies the stress pulse to the first lines.

7. The electronic device according to claim 1, wherein the stress pulse pulses one or more times in a single stress period.

8. The electronic device of claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

9. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

10. The electronic device of claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

11. The electronic device of claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

12. The electronic device of claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

13. A method for driving an electronic device including a semiconductor memory in a test mode, the method comprising:
applying a first maximum voltage to a selected memory cell of a plurality of memory cells to turn on the selected memory cell;
determining whether the selected memory cell is turned on or turned off; and
applying a stress pulse to the selected memory cell only when the selected memory cell is determined to be in a turned-off state, the stress pulse having a lower voltage level than the first maximum voltage.

14. The method according to claim 13, wherein each of the plurality of memory cells has a first turn-on voltage in a normal state, and the plurality of memory cells have a plurality of second turn-on voltages, respectively, in an initial state, the plurality of second turn-on voltages having higher voltage levels than the first turn-on voltage.

15. The method according to claim 14, wherein the first maximum voltage has a voltage level that is equal to or higher than an expectation value of the second turn-on voltages of the memory cells, the expectation value representing a voltage level that the second turn-on voltages are expected to have in the initial state, the expectation value being a single value, and wherein the stress pulse has a voltage level that is equal to or lower than the expectation value of the second turn-on voltages.

* * * * *